(12) United States Patent
Wicht et al.

(10) Patent No.: US 8,203,323 B2
(45) Date of Patent: Jun. 19, 2012

(54) SWITCHED MODE POWER SUPPLY WITH CURRENT SENSING

(75) Inventors: Bernhard Wicht, Munich (DE); Sumeet P. Kulkarni, Munich (DE); Stefan Herzer, Illmenau (DE); Jochen Neidhardt, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/721,377

(22) Filed: Mar. 10, 2010

(65) Prior Publication Data

US 2010/0231187 A1 Sep. 16, 2010

(30) Foreign Application Priority Data

Mar. 12, 2009 (DE) .................. 10 2009 012 767

(51) Int. Cl.
*G05F 1/00* (2006.01)

(52) U.S. Cl. ...................................... 323/285

(58) Field of Classification Search ........... 323/282–286
See application file for complete search history.

(56) References Cited

U.S. PATENT DOCUMENTS

| 3,171,977 | A | | 3/1965 | Sharp |
| 3,747,089 | A | * | 7/1973 | Sharples ........................ 341/167 |
| 5,557,187 | A | * | 9/1996 | Koch et al. ..................... 320/166 |
| 6,127,814 | A | * | 10/2000 | Goder ............................ 323/282 |
| 2004/0217744 | A1 | * | 11/2004 | Walters et al. ................. 323/277 |
| 2005/0275490 | A1 | * | 12/2005 | Luh ................................ 333/217 |
| 2007/0035434 | A1 | * | 2/2007 | Tachibana et al. ............ 341/161 |
| 2007/0103203 | A1 | * | 5/2007 | Makihara ........................ 327/94 |
| 2007/0139242 | A1 | * | 6/2007 | Krymski ........................ 341/155 |
| 2008/0157841 | A1 | | 7/2008 | Johnson |
| 2008/0197823 | A1 | | 8/2008 | Crowther et al. |
| 2009/0039842 | A1 | * | 2/2009 | Chen et al. .................... 323/272 |
| 2010/0109629 | A1 | * | 5/2010 | Umemoto et al. ............. 323/282 |
| 2010/0201555 | A1 | * | 8/2010 | Karavidas et al. ............ 341/143 |

FOREIGN PATENT DOCUMENTS

| DE | 4215444 | 11/1983 |
| DE | 19929034 | 12/2000 |

* cited by examiner

*Primary Examiner* — Adolf Berhane
*Assistant Examiner* — Jeffrey Gblende
(74) *Attorney, Agent, or Firm* — William B. Kempler; Wade J. Brady, III; Frederick J. Telecky, Jr.

(57) ABSTRACT

An electronic device for switched mode DC-DC conversion is provided that includes a stage for sensing an output current causing a voltage difference between a first and a second node. The current sensing stage includes a comparator being capacitively coupled with a first input to the first node and with a second input to the second node for determining a magnitude of the output current.

9 Claims, 6 Drawing Sheets

SWITCHED MODE POWER SUPPLY WITH CURRENT SENSING

CROSS-REFERENCE TO RELATED APPLICATIONS

This patent application claims priority from German Patent Application No. 10 2009 012 767.4, filed Mar. 12, 2009, which is incorporated herein by reference in its entirety.

FIELD OF THE INVENTION

The invention relates to an electronic device and a method for switched mode DC-DC conversion, and more specifically to buck, boost or buck/boost DC-DC converters and a method for operating a buck, boost or buck/boost DC-DC converter.

BACKGROUND OF THE INVENTION

DC-DC converters configured as boost or buck or buck/boost converters can use voltage or current sensing modes for determining the magnitude of an output voltage or an output current. In a current sensing mode, the DC-DC converter may sense an output current with a shunt resistor which is coupled in series into an output path. The output current causes a voltage drop across the shunt resistor. The terminals of the shunt resistor are connected to an amplifier the output signal of which can then be used for controlling DC-DC conversion parameters.

FIG. 1 shows a simplified circuit diagram of a conventional DC-DC converter. There is an integrated circuit IC having a control stage CNTL for generating control signals GA1, GA2 for power MOSFETs PM1 and PM2. PM1 is also referred to as high-side (HS) MOSFET and PM2 as low-side (LS) MOSFET. PM1 and PM2 are driven by a HS and a LS driver, respectively. Through power MOSFETs PM1 and PM2, an output inductor L is alternately switched with one side to input voltage (primary supply voltage) and a ground level. An output voltage VOUT is generated which can be higher (boost mode) or lower (buck mode) than the input voltage level VIN. The output voltage VOUT is buffered on a buffer capacitor CBUF. The output voltage level can be sensed through a voltage divider R1, R2 and fed back to the control stage CNTL for adjusting the switching parameters for power MOSFETs PM1, PM2 so as to provide a stable output voltage VOUT of a certain desired voltage level.

A load (not shown) may be coupled to output node VOUT and an output current IL may be supplied to the load. The output current IL causes a voltage drop across the sense (or shunt) resistor RS which is coupled in series to the output inductor L. The voltage difference between pins SA1 and SA2 is sensed with an amplifier AMP. The amplifier AMP amplifies the voltage difference and provides an output signal to control stage CNTL which can then also be used to control the switching parameters of power MOSFETs PM1, PM2. Such a control parameter can be the clock period or the ratio of the ON-period and the OFF-period of a pulse width modulated (PWM) control signal. This can be used for switching the power MOSFETs PM1, PM2. However, conventional amplifiers which are used for current sensing have a limited common mode range, significant offsets which also vary with the common mode input voltage level and low input impedance values which can adversely affect the current sensing by a finite input current into AMP through terminals SA1 and SA2.

SUMMARY OF THE INVENTION

It is a general object of the invention to provide an electronic device and a method for DC-DC conversion using current sensing having higher precision and being less complex than conventional DC-DC converters.

One aspect of the invention, an electronic device for switched mode DC-DC conversion is provided which comprises a stage for sensing an output current causing a voltage difference between a first and a second node. The current sensing stage can comprise a comparator. A first input of the comparator can be capacitively coupled to the first node and a second input can be capacitively coupled to the second node for determining a magnitude of the output current. This aspect of the invention can be used to overcome the high common mode requirements for the comparator due to a large output voltage range of the DC-DC conversion. Furthermore, the capacitive coupling can provide high impedances for the first node and the second node (e.g. the terminals of a shunt resistor or an inductor). Capacitive coupling can also provide good matching properties which can be useful to reduce offset at the comparator input.

The capacitive coupling can be implemented with two or more capacitors. A first capacitor may then be coupled in series to the first input of the comparator. A second capacitor may be coupled in series to the second input of the comparator. In other words, the first capacitor is coupled with a first side to the first node and with a second side to the first input of the comparator and the second capacitor can be coupled with a first side to the second node and with a second side to the second input of the comparator.

The capacitors may be selectively coupled to the first node and the second node and the first input and second input of the comparator, respectively. A first switch may then be coupled between the first side of the first capacitor and the first node. A second switch may be coupled between the first side of the first capacitor and the first side of the second capacitor for alternately connecting the first side of the first capacitor with the first node or with the first side of the second capacitor.

Generally, the voltage difference between the first node and the second node can be caused by a shunt resistor. However, in one aspect of the invention, the shunt resistor may be a parasitic inherent resistance of the output inductor. This means that the voltage difference between the first node and the second node is due to a voltage drop across the inductor due to its parasitic inherent resistance. This is a very efficient way of sensing the output current as no additional components have to be coupled into the output path. However, using only the parasitic resistance of the inductor imposes higher requirements to the current sensing circuit as this resistance is very small. The embodiments of the invention are capable of overcoming or reducing these problems.

In another aspect of the invention, a third capacitor, a resistor and an output inductor may be provided. These additional components may be used in combination with aspects of the invention for implementing a direct current resistance (DCR) mechanism. This can provide an increased efficiency as it removes the voltage drop across an extra shunt resistor. The inductor may then be an output inductor which is used for DC-DC conversion. A series of the third capacitor and the resistor may then be coupled in parallel to the output inductor. The first node and the second node may then be, for example the terminals of the capacitor.

The resistor and the capacitor may then be dimensioned so as to match the time constant of the inductor including a finite series resistance. This can be expressed as $RC = L/DCR$, where DCR is the parasitic series resistance of the inductor, L is the inductance of the output inductor and R, and C are the resistance and the capacitance of the capacitor and the resistor coupled in parallel to the inductor.

In an aspect of the invention, a third switch and a fourth switch may be provided and configured so as to selectively couple a second side of the first capacitor and a second side of the second capacitor to a common voltage node. This can be used to adjust the capacitive coupling to a specific input common mode range of the comparator. During a refresh period, the first capacitor and the second capacitor may then both be coupled with their second sides to the common mode voltage level. Also the first sides of the capacitors may then be coupled to each other so as to set both capacitors to a same voltage level. This can be used to ensure that the capacitive coupling is periodically initialized.

In a further aspect of the invention, a fifth switch may be coupled between the second side of the first capacitor and the first input of the comparator. A sixth switch may be coupled between the second side of the second capacitor and the second input of the comparator. This aspect of the invention is in several aspects. During a refresh of the capacitive coupling, the inputs of the comparator can be disconnected from the capacitors. The inputs (i.e. the input capacitances) of the comparator may then preserve a voltage level instead of being affected by the refresh of the capacitors used for capacitive coupling. This aspect can especially be applied if the voltage difference (i.e. the output current) changes only slowly.

A control stage may be provided for controlling the various switches. The control stage may issue various clock signals for switching the switches. The first switch may then be controlled to be conducting during a first phase of a clock signal and the second switch may be controlled to be conducting during a second phase of the clock signal. The first phase and the second phase may be phases of two non-overlapping clock signals having the same clock period. The third switch and fourth switch may also be conducting during the second phase. The fifth switch and the sixth switch may then be conducting during the first phase. The first phase can then be referred to as the sampling period and the second phase can be referred to as the refresh period.

The control stage may be adapted to generate a pulse width modulated (PWM) signal for DC-DC conversion. The PWM signal may have a PWM clock period. The same clock period may then be used for clock signals for controlling the first switch to sixth switch. The PWM signal may have a first portion (e.g. ON-period) and a second portion (e.g. OFF-period). The ratio of these portions, or ON and OFF-periods (or duty cycle) of the PWM signal may be varied for adjusting an output current (or an output voltage) of the DC-DC conversion. The first phase may then be correlated with a first portion (ON-period) of the PWM signal and the second phase may be correlated with a second portion (e.g. OFF-period) of the PWM. In an embodiment, the beginning of a second phase (refresh period) may be triggered through the beginning of an OFF-period (e.g. with a falling edge) of the PWM signal.

In one aspect of the invention, the refresh and sampling periods may be prolonged or reduced in accordance with the OFF-periods and ON-periods of the PWM signal. However, in one aspect of the invention, a minimum length of the second phase may always be preserved. The minimum length may even be preserved if the second portion (e.g. OFF-period) of the PWM clock signal is shorter than a minimum or zero. The refresh period may be performed with a minimum length even if the PWM signal has no OFF-period. This may be the situation, if the current consumption rises such that for a certain amount of time, OFF-periods are completely suppressed. Even in this situation, the refresh periods may periodically be performed, i.e. that the first and second capacitor are periodically decoupled from the comparator input or the first and/or second node for performing a refresh cycle of a minimum duration. The duration of the second phase may always be kept greater than 20% to 30% of the PWM clock period.

In still another aspect of the invention, the output of the comparator may not be evaluated during a blanking period. This blanking period may be performed after coupling the comparator inputs to the first and second node. In other words, the comparator output may not be evaluated during a blanking period after beginning of the sampling period (beginning of the first phase). This is an efficient way of eliminating spikes and comparator output errors due to charge injection of the switches and other artifacts due to switching (including PM1 and PM2). In an embodiment, the blanking period may also be correlated to the second phase (refresh period). If a refresh period occurs without an OFF-period (no second phase), the blanking period may be chosen at least 10% longer than an end of a refresh period (i.e. a second phase).

The first switch can be a MOSFET and the second switch can be a MOSFET and a control gate of the MOSFETs can be controlled with a bootstrap circuit. This provides that the MOSFETs can be completely turned-on. This is useful for switching an NMOS transistor. Otherwise PMOS transistors have to be used, which require level shifters and provide higher ON resistance. Such a bootstrap circuit may comprise a diode, a capacitor and a buffer. The diode may be coupled with an anode to the first or second node respectively and with a cathode to the respective control input of the MOSFET. The clock signals for switching the MOSFETs may then be fed to the respective control gates of the MOSFETs through a series of a buffer and a capacitor. The capacitor will then be charged through the diode to a voltage level that is higher than the voltage on either the first or second node.

In another aspect of the invention, the area of transistors of an input stage of the comparator may be increased so as to improve matching of the input transistors. This seems a counterintuitive measure as increasing the area of the input transistors also increases the input capacitance of the comparator. In combination with the capacitive coupling (first and second capacitor) a capacitive divider is implemented which can significantly impair the performance and precision of the current sensing stage. However, the fifth switch and the sixth switch in front of the inputs of the comparator can be used to disconnect the inputs during the second phase (refresh period). The input capacitance of the comparator may then store a certain amount of charge so as to basically preserve the last input voltage level. The input capacitors may be charged step-by-step during multiple consecutive clock cycles. After being charged, the input voltage is persevered. This means that for slow variations of the voltage difference between the first and second node, the input transistors of the comparator can be increased without significantly affecting the overall performance of the current sensing stage. Moreover, the large input transistors provide improved matching and therefore reduced offset. Even very small voltage difference values between first and second node may be detected and correctly evaluated.

In another aspect, the capacitance values and area of the first and second input capacitors may also be dimensioned in accordance with the minimum voltage difference between first and second node that is to be detected with the current sensing stage.

The invention also provides a method of operating an electronic device for switched-mode DC-DC conversion. A comparator input is capacitively coupled to receive a voltage difference caused by an output current (of the DC-DC conversion) during a sampling period (first phase) and the DC- DC conversion is controlled in response to a comparator output signal. The comparator input can be decoupled from the first and second node during a refresh period (second phase). The sampling period and the refresh period may be two different clock phases of the same clock signal. The sampling period may correlate with a first portion of a pulse width modulated (PWM) clock signal for controlling the switching of the DC-DC conversion. The refresh period may correlate with a second portion of the PWM clock signal. The refresh period of may be periodically performed even if the second portion (e.g. the OFF period of the PWM signal) becomes very short of or even zero. The refresh period may always have a minimum duration, even if the PWM signal has no second portion (i.e., for example the OFF period is skipped). There may also be a blanking period after capacitively coupling the comparator input to receive voltage difference. The output of the comparator may not be evaluated during the blanking period. The blanking period may be longer than the refresh period.

BRIEF DESCRIPTION OF DRAWINGS

Further aspects of the invention will ensue from the description herein below of preferred embodiments of the invention with reference to the accompanying drawings, wherein.

DESCRIPTION OF THE EMBODIMENTS

Figure 1:
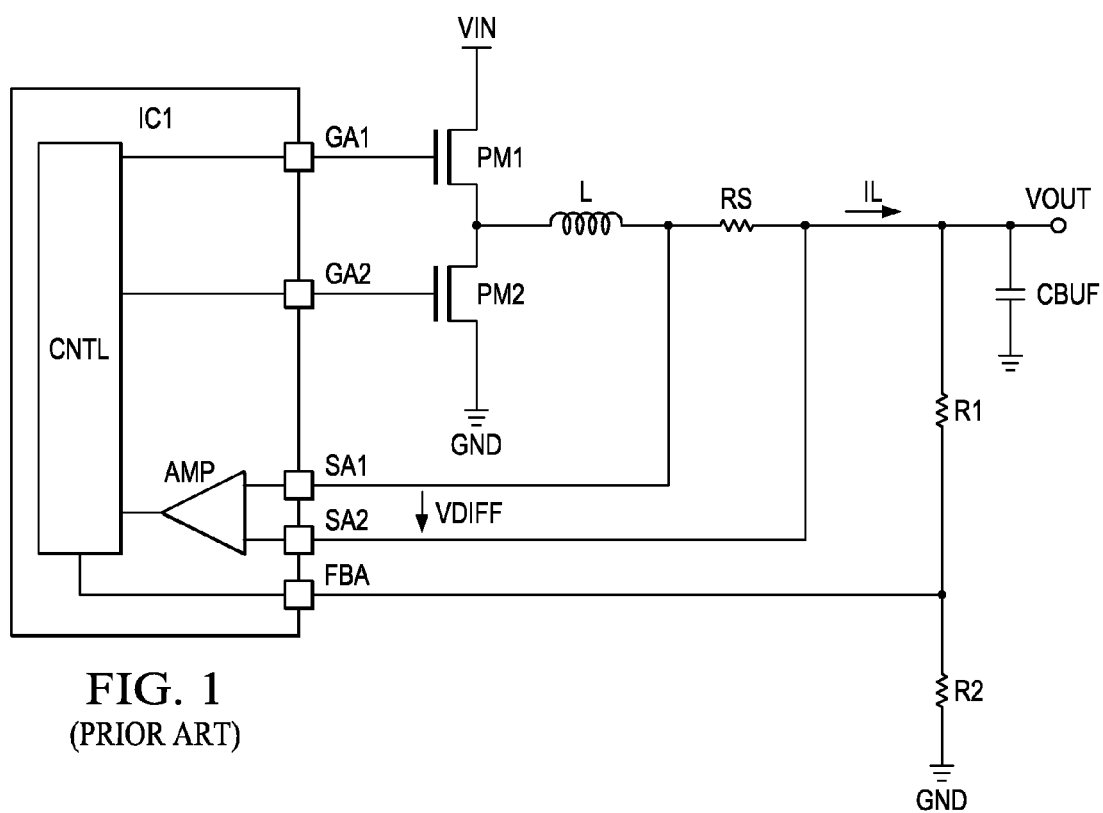
FIG. 1 shows a simplified circuit diagram of a conventional DC-DC converter with a current sensing stage according to the prior art.
Figure 2:
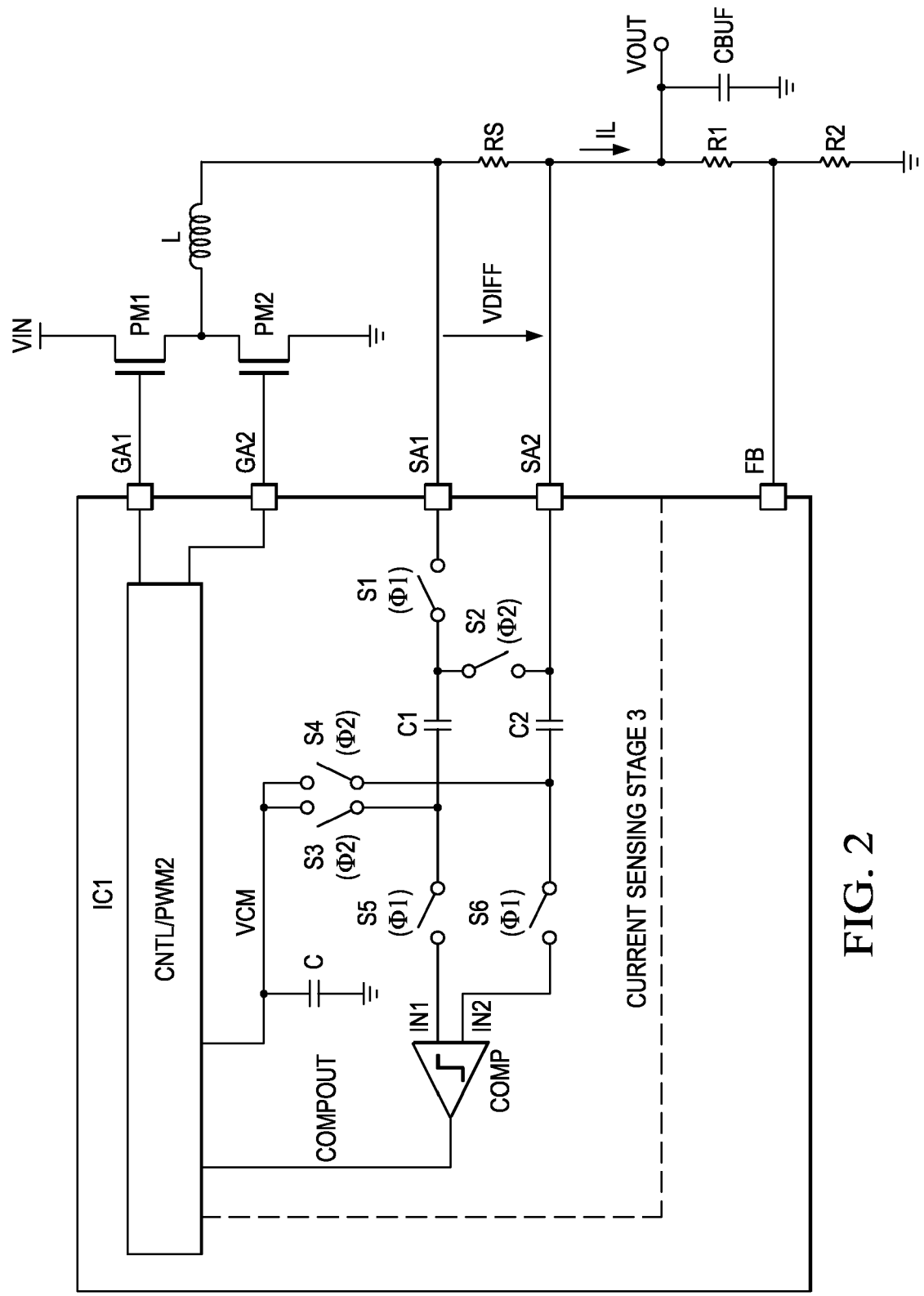
FIG. 2 shows a simplified circuit diagram of an electronic device according an embodiment of the invention.

FIG. 2 shows a simplified circuit diagram of an embodiment of the invention. As described with respect to FIG. 1, control stage CNTL provides control signals for switching power MOSFETs PM1 and PM2 ON and OFF. An output voltage VOUT is generated on an output node and may be buffered with a buffer capacitor CBUF. A shunt resistor RS is coupled into the output path. A load current IL which is supplied from the inductor L to the output node VOUT may then cause a voltage drop across shunt resistor RS. There is a voltage difference VDIFF between nodes SA1 and SA2 which may be input pins of the integrated circuit 1. The current sensing stage 3 includes capacitively coupled comparator COMP. A first input IN1 and a second input IN2 of the comparator COMP are now selectively and capacitively coupled to nodes SA1 and SA2. Comparator COMP detects a magnitude of the voltage difference and/or a relationship between the voltage levels on the first node SA1 and the second node SA2 and provides a corresponding output signal COMPOUT. The comparator output signal COMPOUT is fed to control stage CNTL, which is configured to adjust the control signals GA1, GA2 for the control gates of the power MOSFETs in accordance with the comparator output signal.

The capacitive coupling of the comparator inputs IN1, IN2 to the first node SA1 and the second node SA2 can be implemented with two capacitors C1, C2 and several switches S1 to S6. The first capacitor C1 is coupled with a first side to the first node SA1 through a first switch S1. The second capacitor C2 is coupled with a first side to the second node SA2. A second switch S2 is provided for connecting the first sides of the first capacitor C1 and second capacitor C2. The second side of the first capacitor C1 is coupled through a third switch S3 to a common mode voltage node VCM. The second side of the second capacitor C2 can also be coupled through a fourth switch S4 to the common mode voltage node VCM. There is a fifth switch S5 for connecting the second side of the first capacitor C1 to the first input IN1 of the comparator COMP. There is a sixth switch S6 for connecting the second side of the second capacitor C2 to the second input IN2 of the comparator COMP.

The switches S1 to S6 can be controlled with two clock signals: a first clock signal $\Phi1$ and a second clock signal $\Phi2$. The two clock signals $\Phi1$, $\Phi2$ may be two non overlapping clock signals having opposite logic levels and the same clock period. Switches S1, S5 and S6 are controlled with the first clock signal $\Phi1$. Switches S2, S3 and S4 are controlled with the second clock signal $\Phi2$. Either the first clock signal $\Phi1$ or the second clock signal $\Phi2$ is high. If the first clock signal $\Phi1$ is high and the second clock signal $\Phi2$ is low, i.e. $\Phi1=1$ and $\Phi2=0$, switches S1, S5 and S6 are conducting and switches S2, S3, and S4 are disconnected. This state is referred to as the first phase or sampling period. If the first clock signal is low and the second clock signal is high (i.e. $\Phi1=0$ and $\Phi2=1$) switches S1, S5 and S6 are disconnected and switches S2, S3 and S4 are conducting. This is referred to as the second phase of refresh period. During the sampling period the terminals of the shunt resistor are connected through capacitors C1, C2 to the inputs IN1, IN2 of the comparator COMP. The comparator output will then change its output value in accordance with the value of the voltage difference VDIFF across the shunt resistor RS, i.e. the voltage difference between the first node SA1 and the second node SA2.

During the refresh period, the second sides of capacitors C1 and C2 are coupled to a common mode voltage level VCM. Also the first sides of capacitors C1 and C2 are coupled together through switch S2. The second sides may then be coupled to the output node VOUT. This provides that any difference in the voltage levels across each of the capacitors is eliminated. This ensures an almost ideal initial offset voltage of 0 Volt. The capacitive coupling provides a large common-mode input range and a high input impedance. The superior matching properties of capacitors C1, C2 minimize offset errors. If the electronic device is implemented as an integrated circuit, the capacitors may be optimized with respect to matching (e.g. having large areas). The bottom plate of integrated capacitors C1, C2 may then be coupled to common mode voltage VCM and the top plate to VOUT.

During the sampling or sensing period, the first sides (e.g. bottom plates of capacitors C1, C2) may then follow the voltage on first and second nodes SA1, SA2 which are coupled to receive the voltage difference VDIFF. FIG. 2 shows several pins GA1, GA2, SA1, SA2, which can be regarded as pins of an integrated circuit. This configuration suggests a certain partitioning of integrated components and discrete components. However, in this and the other embodiments, also other components may be integrated into IC1 or implemented as external components. In particular the power MOSFETs PM1 and PM2 may be integrated into IC1.

The common mode voltage level VCM may be optimized to accommodate the common mode input voltage requirements of comparator COMP. A level of 0.8 V or 0.9 V may be used for VCM. In an embodiment, the level of the common mode input voltage VCM may be a fraction of a reference voltage level used for the voltage feedback loop. The reference voltage level may then be lower than the smallest output voltage level VOUT. This ensures proper operation of a resistive voltage divider coupled to VOUT and to the feedback voltage pin FB.

Figure 3:
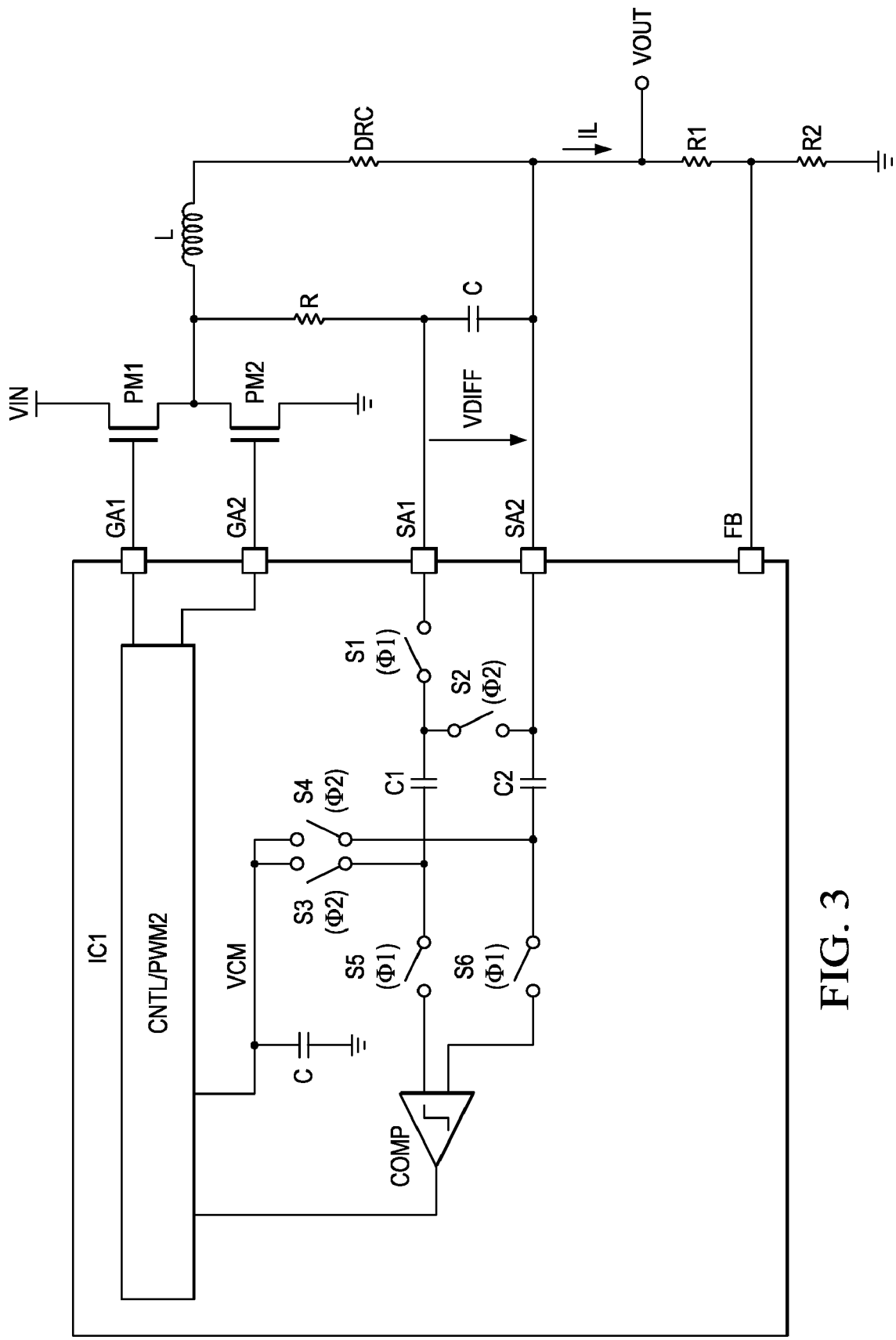
FIG. 3 shows a simplified circuit diagram of an electronic device according to an embodiment of the invention.

FIG. 3 shows another embodiment of the invention. The current sensing stage 3 is similar to the current sensing stage 3 shown in FIG. 2. However, this embodiment uses a direct current resistance (DCR) coupling. Applying the DCR sensing principle is particularly advantageous in combination with aspects and embodiments of the invention, as many drawbacks of prior art current sensing stages are eliminated. For DCR sensing, a series of a resistor R and a capacitor C are coupled in parallel to the output inductor L. Resistor DCR is not a real component but represents the parasitic series resistance of inductor L. The first and second nodes SA1 and SA2 are now coupled to capacitor C. The voltage VDC across capacitor C is then $$VDC = (V:N - VOUT)\frac{DCR}{DCR + \omega L}$$

The voltage difference VDIFF can then be determined as $$VDIFF = (VIN - VOUT)\frac{1}{\omega C\left(R + \frac{1}{\omega C}\right)}$$

The voltage difference VDIFF across the capacitor is equal to the voltage drop VDCR across the inductor L, i.e. VDIFF is equal to VDCR when the time constant of the inductor L and the time constant of the RC-network are equal:

$$VDIFF = \frac{1}{\omega C\left(R + \frac{1}{\omega C}\right)} = \frac{DCR}{DCR + \omega L}; \frac{L}{DCR} = RC; \tau_{DCRL} = \tau_{RC}$$

Figure 4:
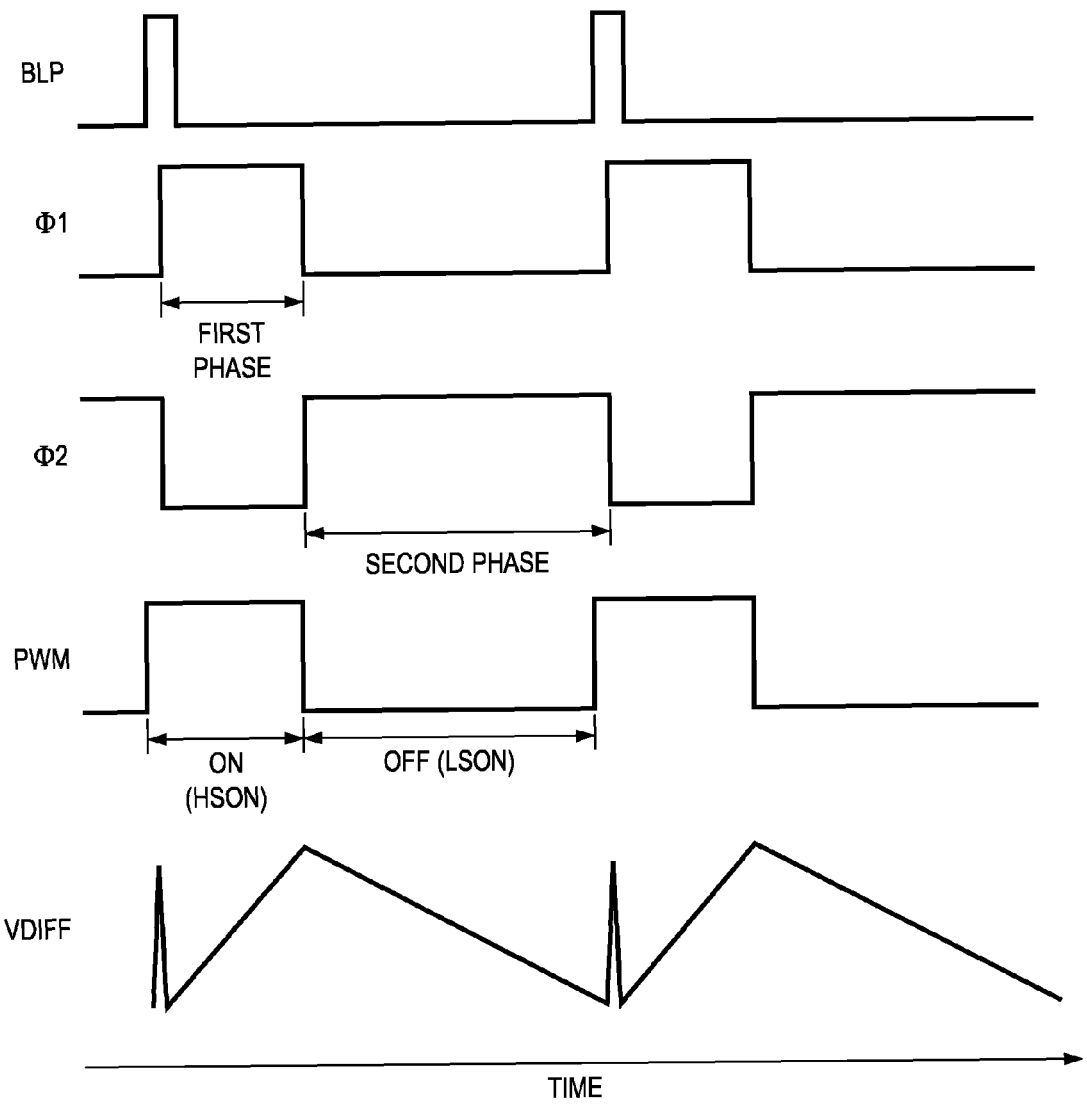
FIG. 4 shows waveforms relating to clock signals configured in accordance with aspects of the invention.

FIG. 4 shows waveforms relating to control and clock signals for the embodiments of the present invention shown in FIG. 2 and FIG. 3. A pulse width modulated signal PWM may be used for controlling the duty cycle or ON-OFF-ratio of the power MOSFETs PM1, PM2 of FIGS. 2 and 3. If PWM is high (ON) PM1 is conducting and the inductor is connected to VIN. This is also referred to as high-side ON period (HSON). If PWM is low (OFF), power MOSFET PM2 is conducting and PM1 is switched OFF. Inductor L is then connected to ground. This is also referred to as low-side ON period (LSON). The ratio of ON to OFF periods of pulse width modulated signal PWM is the duty cycle of the PWM signal which is used to adjust output voltage level VOUT and output current IL. If more output current IL is required, the ON-periods are prolonged and the OFF-periods are reduced. The first clock signal Φ1 and the second clock signal Φ2 can be derived from the PWM signal. They are used as described with respect to FIG. 2. They may be configured to be non-overlapping. In FIG. 4 they are simply represented as inverted signals. A first phase or sampling period occurs if the first clock signal Φ1 is high. If the second clock signal Φ2 is high, a second phase or refresh period occurs. If a sampling period begins (rising edge of Φ1), a sudden peak of VDIFF may occur due to charge injection effects of the switches (e.g. MOSFETs used as switches). These sudden peaks may affect the comparator output signal COMPOUT. Therefore a blanking signal BLP is provided which is enabled (BLP=1, blanking periods or blanking pulses) synchronously with rising edges of the PWM signal. During a high period of the blanking signal, the output of the comparator is ignored. This turned out to be more efficient and robust than an analog mechanism as for example clamping the comparator inputs.

Figure 5:
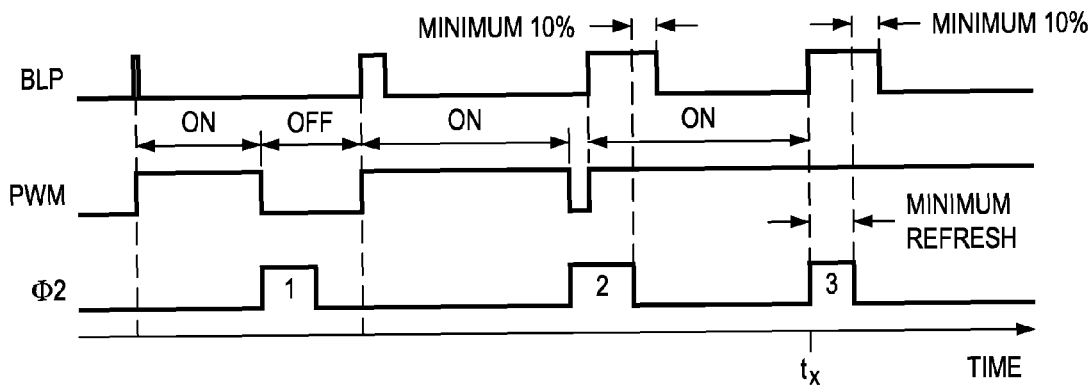
FIG. 5 shows waveforms relating to clock signals configured in accordance with aspects of the invention.

FIG. 5 shows waveforms relating to an aspect of the invention. If more output current IL is required, the ratio of ON- to OFF-periods of the PWM signal is adjusted. The ON-periods are prolonged while the OFF-periods are reduced. This can result in a situation where no OFF-periods occur and PWM remains constantly high. However, in this aspect of the invention, even without OFF-periods of the PWM signal, refresh periods (Φ2=1) are performed. Furthermore, the refresh periods always have a minimum length. As shown for the second pulse (2.) of the second clock signal Φ2, the signal is kept high although the PWM signal returned to high. For the third pulse (3.) at time tx, the PWM signal has not returned to low (OFF-period is skipped) and even then a refresh pulse is issued and maintained for the minimum duration to ensure that the capacitors are initialized. Furthermore, also the blanking pulses of blanking signal BLP are issued even if no OFF-period occurs. The duration of the blanking pulses exceed the refresh pulses in order to ensure that no artifacts or disturbances at the comparator input occur during evaluation of the output signal. The minimum duration of a refresh pulse (Φ2=1) may be 20% to 30% of the period of the PWM signal. The blanking pulses may be about 10% longer than the refresh pulses, i.e. the falling edge of the blanking pulse occurs later than the falling edge of the refresh period.

Figure 6:
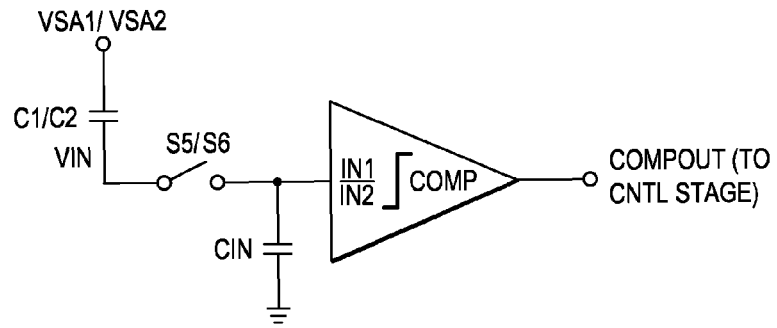
FIG. 6 is a simplified circuit diagram showing aspects of the invention.

FIG. 6 is a simplified circuit diagram illustrating another aspect of the invention. It shows the comparator COMP of FIGS. 2 and 3 and input capacitor C1 or C2 coupled to a respective input IN1 or IN2 of the comparator. Only one input path is shown though this aspect of the invention relates to both input paths. Furthermore, there is a parasitic input capacitor CIN of the comparator COMP. In order to improve matching of the input stage of the comparator COMP, the input transistors (two transistors of a differential input stage) may be dimensioned to have a large area. The area can be increased until the mismatch statistically (with a statistical certainty) remains below a maximum value. The mismatch relates to an input offset value, which may then remain below a maximum admissible value. A simplified procedure of designing an electronic device for DC-DC conversion may then include the following considerations and approximations. The expected minimum voltage drop across a shunt resistor RS or the capacitor C for DCR sensing may be VDIFFMIN. A maximum input related offset voltage VOFFMAX of the comparator should remain well below VDIFFMAX. The maximum input related offset error VOFFMAX depends on the area AT of the input transistors according to the relation VOFFMAX~k/sqrt(AT). The matching constant k is technology dependent.

However, increasing the input transistors increases the gate capacitance of the transistors if MOSFETs are used. The input capacitor CIN can then form a capacitive voltage divider with the respective capacitor C1, C2. This is usually regarded as adversely affecting the comparator performance. However, this drawback is overcome with the switched capacitive coupling according to aspects of the invention. This is based on the observation that using the input switches S5, S6 eliminates the negative influence of the input capacitance. This is because the capacitive division applies only to the voltage difference between the previous and the recent phase, not to the much larger absolute voltage at inputs SA1 and SA2. Good matching of the input stage of the comparator and a small offset can be achieved.

Figure 7:
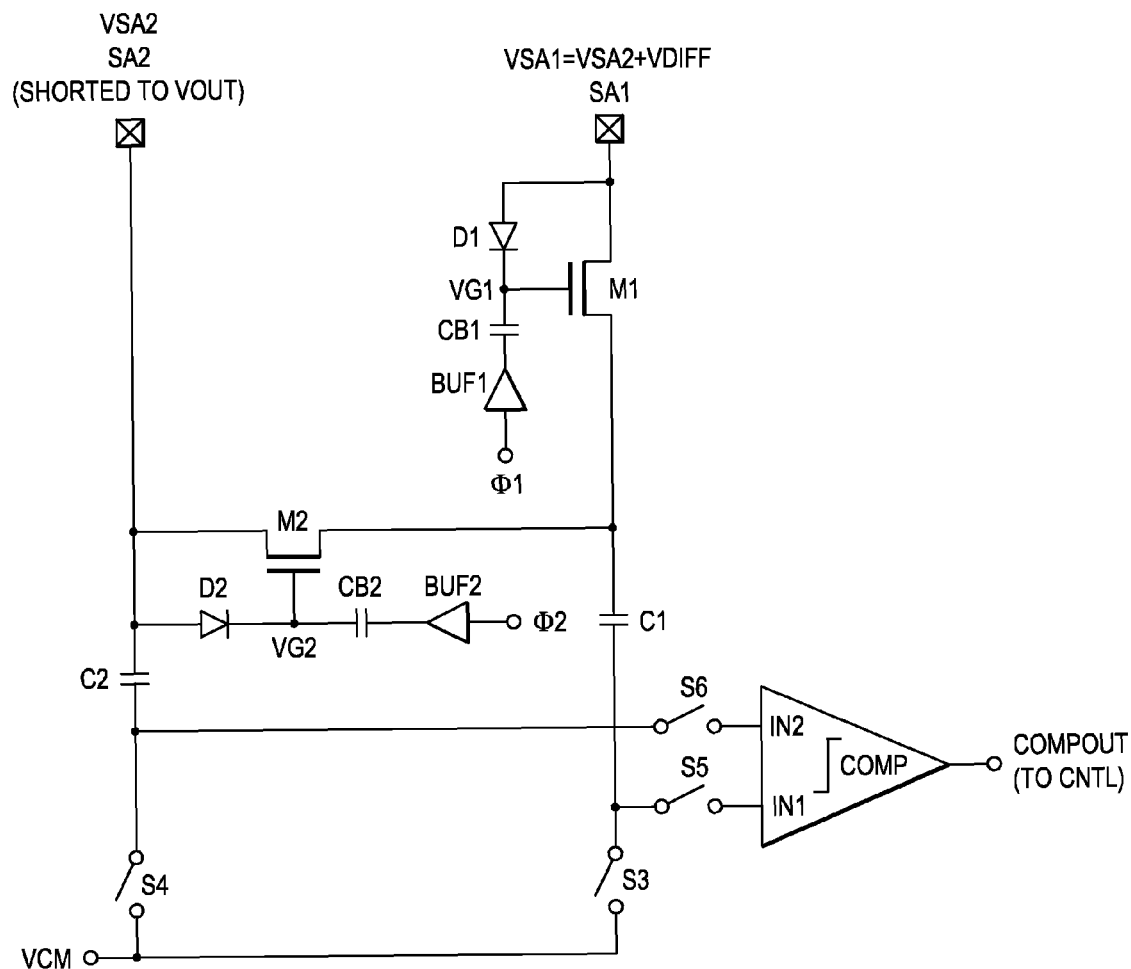
FIG. 7 is a simplified circuit diagram showing further aspects of the invention.

FIG. 7 shows a simplified circuit diagram of an embodiment of the invention. FIG. 7 shows the current sensing stage as shown in FIGS. 2 and 3 but with a specific advantageous implementation for switches S1 and S2. These two switches are coupled to the first and second node SA1, SA2 (or pins SA1 and SA2). Therefore, theses switches may both experience a voltage level that can be higher than an internal supply voltage used for the control stage CNTL or the comparator COMP. In this aspect of the invention the first and the second switch are driven with boosted voltage levels derived from the first node (SA1) and the second node (SA2) respectively. The first transistor M1 is coupled with a channel to the first node and a first side of the first capacitor C1. A first diode is coupled forward biased between the first node SA1 and the control gate of the first transistor M1. The control gate is also coupled with a first side of a capacitor CB1. The other side of this capacitor CB1 is coupled to an output of the first buffer BUF1. The input of the first buffer receives clock signal $\Phi 1$. The second switch is implemented with the second transistor M2 which is coupled with a channel between the first sides of the first capacitor and the second capacitor C1 and C2. A second diode is coupled between the second node SA2 and the control gate of the second transistor M2. A first side of a capacitor CB2 is also coupled to the control gate of transistor M2. The other side of capacitor CB2 is coupled to the output of a second buffer the input of which receives clock signal $\Phi 2$. Switches S3, S4, S5 and S6 as well as comparator COMP work as described with respect to FIGS. 2, 3, 4, 5 and 6. However, the control gate of the first transistor M1 is now raised (boosted) to a voltage level $$VG1 = VSA1 - VD1 + SWINGBUF1,$$

wherein VD1 is the voltage drop across the first diode and SWINGBUF1 is the output swing of the first buffer BUF1. The maximum voltage on the control gate of the second transistor M2 is $$VG2 = VSA2 - VD2 + SWINGBUF2 = VOUT - VD2 + SWINGBUF2,$$

wherein VD2 is the voltage drop across the second diode and SWINGBUF2 is the output swing of the second buffer BUF2. This provides that the first transistor (switch) M1 and the second transistor (switch) M2 can be completely turned-on with only a minimum ON resistance. According to this aspect of the invention clock signals with low voltage levels can be used for the first and second transistors and no level shifters are required.

Figure 8:
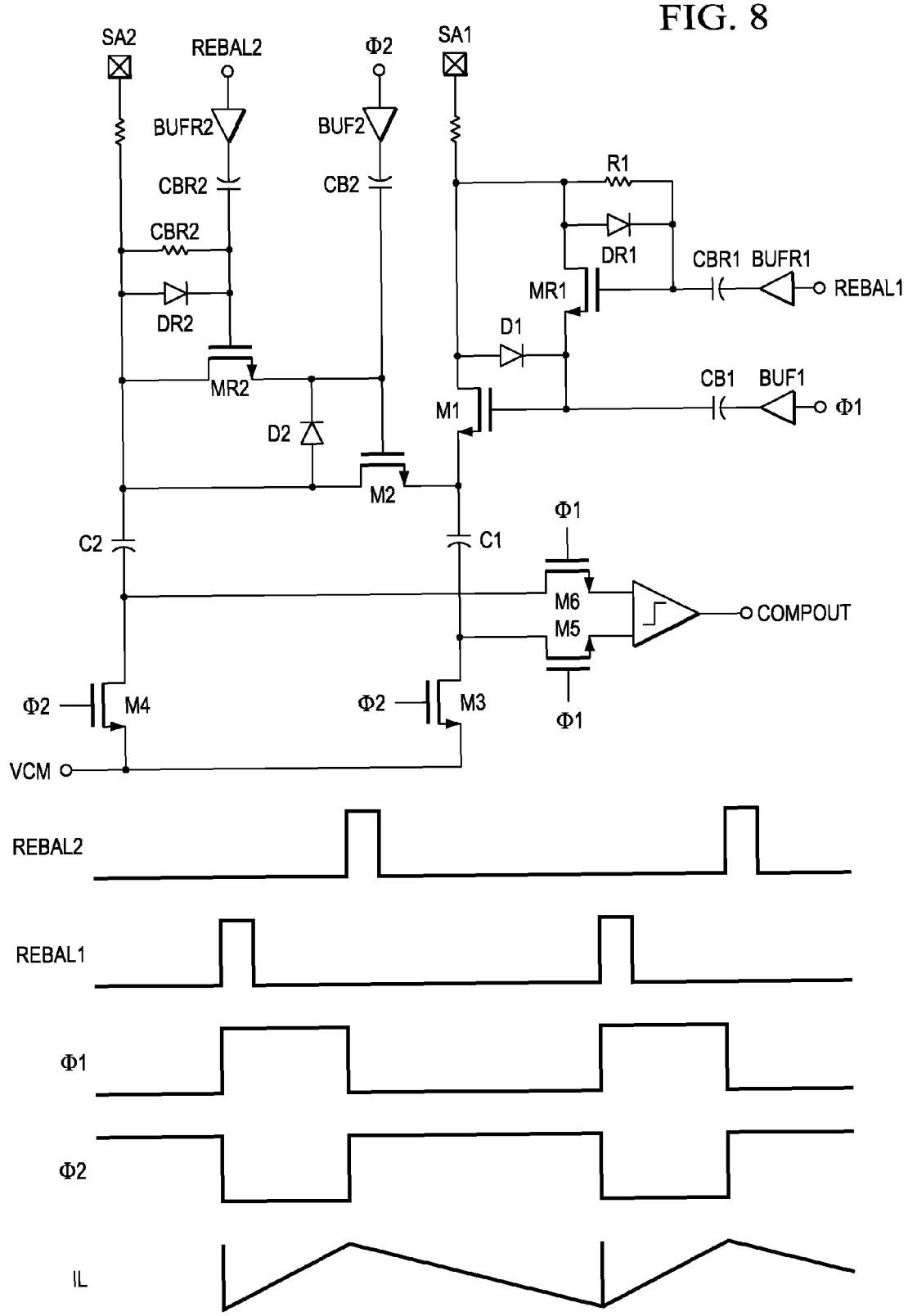
FIG. 8 is a simplified circuit diagram showing further aspects of the invention.

FIG. 8 shows a simplified circuit diagram of another embodiment of the invention. The circuitry is basically similar to the circuitry shown in FIG. 7. However, for falling voltages on pins SA1 and SA2, the boost capacitors may preserve charge and keep the first and the second transistors M1, M2 turned on. Therefore, a first rebalance transistor MR1 is coupled with its channel between the gate of the first transistor M1 and node SA1 and a second rebalance transistor MR2 is coupled with its channel between the gate of the second transistor M2 and the second node SA2. These two additional transistors MR1, MR2 are also driven with bootstrap circuits (DR1, CBR1 and BUFR1 for MR1 and DR2, CBR2 and BUFR2 for MR2) for turning transistors MR1 and MR2 on. The two corresponding control signals REBAL1 and REBAL2 are shown below the circuit diagram. In this embodiment, the control signals REBAL1, REBAL2 are pulsed signals which are synchronized with the rising edge of the first clock signal $\Phi 1$ (for REBAL1) and the second clock signal $\Phi 2$ (for REBAL2), respectively. The rebalance transistors and/or the length of the rebalance pulses (REBAL1, REBAL2=1) may be dimensioned so as to discharge the gate terminals of the first and second transistors only after several pulses. This can serve to save power and chip area. According to a further aspect of the invention, a resistor CBR1, CBR2 may be coupled between the gate of the first rebalance transistor MR1 and node SA1, as well as between the gate of the second rebalance transistor MR2 and node SA2. This provides that also the gates of the rebalance transistors are smoothly discharged for falling voltage levels on SA1, and SA2.

Although the present invention has been described in detail, it should be understood that various changes, substitutions and alterations can be made hereto without departing from the spirit and scope of the invention as defined by the appended claims.

The invention claimed is:

1. An electronic device for switched mode DC-DC conversion comprising a stage for sensing an output current causing a voltage difference between a first and a second node, wherein the current sensing stage comprises a comparator being capacitively coupled with a first input to the first node and with a second input to the second node for determining a magnitude of the output current, wherein a first capacitor is coupled in series to the first input of the comparator and a second capacitor is coupled in series to the second input of the comparator, a first switch is coupled between one side of the first capacitor and the first node and a second switch is coupled between the first side of the first capacitor and a first side of the second capacitor for alternately connecting the first side of the first capacitor to the first node or to the first side of the second capacitor, further comprising a third switch and a fourth switch for coupling a second side of the first capacitor and a second side of the second capacitor to a common mode voltage node and a fifth switch coupled between the second side of the first capacitor and the first input of the comparator and a sixth switch coupled between the second side of the second capacitor and the second input of the comparator, the first, fifth and sixth switches being operated by a first clock signal, the second, third and fourth switches being operated by a second clock signal, the second clock signal being of opposite phase to the first clock signal, wherein during a first phase of the first clock signal the voltage difference across the first and second nodes is sampled and during the first phase of the second signal the first and second capacitors are not discharged and are coupled to a common mode voltage.

2. The electronic device according to claim 1, wherein the voltage difference between the first node and the second node is caused by a shunt resistor and the shunt resistor is a parasitic inherent resistance of an output inductor.

3. The electronic device according to claim 2, further comprising a third capacitor, and a resistor wherein a series of the third capacitor and the resistor is coupled in parallel to the output inductor and the first node and the second node are terminals of the capacitor.

4. A method of operating an electronic device for performing DC-DC conversion, the method comprising:

capacitively coupling a comparator input to receive a voltage difference caused by an output current during a sampling period and controlling the DC-DC conversion in response to a comparator output signal, wherein the capacitive coupling comprises coupling a first capacitor in series to the first input of the comparator and coupling a second capacitor in series to the second input of the comparator, coupling a first switch between one side of the first capacitor and the first node and coupling a second switch between the first side of the first capacitor and a first side of the second capacitor for alternately connecting the first side of the first capacitor to the first node or to the first side of the second capacitor, further comprising providing a third switch and a fourth switch for coupling a second side of the first capacitor and a second side of the second capacitor to a common mode voltage node and providing a fifth switch coupled between the second side of the first capacitor and the first input of the comparator and a sixth switch coupled between the second side of the second capacitor and the second input of the comparator, the first, fifth and sixth switches being operated by a first clock signal, the second, third and fourth switches being operated by a second clock signal, the second clock signal being of opposite phase to the first clock signal, wherein during a first phase of the first clock signal the voltage difference across the first and second nodes is sampled and during the first phase of the second signal the first and second capacitors are not discharged and are coupled to a common mode voltage.

5. The method according to claim 4, further comprising decoupling the comparator input during a refresh period.

6. The method according to claim 5, wherein the sampling period correlates with a first portion of a pulse width modulated (PWM) clock signal for controlling the switching of the DC-DC conversion and the refresh period correlates with a second portion of the PWM clock signal.

7. The method according to claim 6, wherein the refresh period of a minimum duration is also performed if the second portion of the PWM clock signal is skipped.

8. The method according to claim 6, wherein the output of the comparator is not evaluated during a blanking period after capacitively coupling the comparator inputs.

9. The method according to claim 8, wherein the blanking period is longer than the refresh period.

* * * * *